(12) United States Patent
Park et al.

(10) Patent No.: US 8,435,876 B2
(45) Date of Patent: May 7, 2013

(54) METHOD OF MANUFACTURING SEMICONDUCTOR DEVICE

(75) Inventors: Jongchul Park, Gyeonggi-do (KR); Jong-Kyu Kim, Hwaseong-si (KR); Ki-jin Park, Seoul (KR); Sangsup Jeong, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/287,345

(22) Filed: Nov. 2, 2011

(65) Prior Publication Data

US 2012/0142179 A1    Jun. 7, 2012

(30) Foreign Application Priority Data

Dec. 2, 2010    (KR) ........................ 10-2010-0122283

(51) Int. Cl.
*H01L 21/28* (2006.01)
*H01L 21/30* (2006.01)

(52) U.S. Cl.
USPC ............ 438/586; 257/E21.507; 257/E21.538; 257/E21.627; 257/E21.641; 257/E21.658; 438/597; 438/618; 438/621; 438/666

(58) Field of Classification Search ........... 257/E21.507, 257/E21.538, E21.627, E21.641, E21.658; 438/586, 597, 618, 621, 666
See application file for complete search history.

(56) References Cited

U.S. PATENT DOCUMENTS

| 7,538,036 B2 | 5/2009 | Busch et al. |
| 2007/0207620 A1 | 9/2007 | Doebler |
| 2008/0160774 A1 | 7/2008 | Kim et al. |

FOREIGN PATENT DOCUMENTS

| KR | 10-0780652 B1 | 11/2007 |
| KR | 10-0790999 B1 | 12/2007 |
| KR | 10-2008-0001925 A | 1/2008 |
| KR | 10-2008-0022398 A | 3/2008 |
| KR | 10-0850216 B1 | 7/2008 |

*Primary Examiner* — Asok K Sarkar
(74) *Attorney, Agent, or Firm* — Lee & Morse, P.C.

(57) ABSTRACT

A method of manufacturing a semiconductor device includes forming a lower film including a cell region and a peripheral circuit region, forming a first sacrificial film on the lower film, the first sacrificial film having trenches in the cell region, forming a second sacrificial pattern on the first sacrificial film, the second sacrificial pattern having line-shaped patterns spaced apart from each other and crossing the trenches in the cell region, and the second sacrificial pattern covering a top surface of the first sacrificial film in the peripheral circuit region, and patterning the first sacrificial film to form upper holes in portions of the trenches exposed by the second sacrificial pattern.

20 Claims, 11 Drawing Sheets

METHOD OF MANUFACTURING SEMICONDUCTOR DEVICE

CROSS-REFERENCE TO RELATED APPLICATIONS

Korean Patent Application No. 10-2010-0122283, filed on Dec. 2, 2010, in the Korean Intellectual Property Office, and entitled: "METHOD OF MANUFACTURING SEMICONDUCTOR DEVICE," is incorporated by reference herein in its entirety.

BACKGROUND

1. Field

The present inventive concept herein relates to a method of manufacturing a semiconductor device, and more particularly, to a method of manufacturing a semiconductor device including a fine pattern using a mask structure formed of a material including carbon.

2. Description of the Related Art

A semiconductor device includes fine patterns embodying a semiconductor integrated circuit. The fine patterns of the semiconductor device may be manufactured by forming a photoresist pattern on a predetermined lower film for forming a pattern, followed by etching the lower film using the photoresist pattern as an etching mask.

SUMMARY

Embodiments of the inventive concept provide a method of manufacturing a semiconductor device. According to example embodiments, a method of manufacturing a semiconductor device may include forming a lower film including a cell region and a peripheral circuit region, forming a first sacrificial film on the lower film, the first sacrificial film having trenches in the cell region, forming a second sacrificial pattern on the first sacrificial film, the second sacrificial pattern having line-shaped patterns spaced apart from each other and crossing the trenches in the cell region, and the second sacrificial pattern covering a top surface of the first sacrificial film in the peripheral circuit region, and patterning the first sacrificial film to form upper holes in portions of the trenches exposed by the second sacrificial pattern.

The first sacrificial film and the second sacrificial pattern may be formed from a material having carbon as a main ingredient.

Forming the first sacrificial film may include forming first mask patterns on the first sacrificial film, the first mask patterns exposing portions of the first sacrificial film in the cell region, and forming the trenches by patterning the first sacrificial film using the first mask patterns.

Forming the first sacrificial film may include using a chemical vapor deposition process to form an amorphous carbon layer.

Forming the lower film may include forming word lines and bit lines crossing the word lines in the cell region, the first mask patterns crossing the word lines or the bit lines.

Forming the second sacrificial patterns may include forming a second sacrificial film filling the trenches in the first sacrificial film, forming second mask patterns crossing the trenches in the second sacrificial film of the cell region, and patterning the second sacrificial film using the second mask patterns to expose the first sacrificial film.

Forming the second sacrificial film may include using a spin-on coating technology to deposit a material having carbon as a main ingredient.

Forming the first and second mask patterns may include depositing material to a thickness of about 0.1 to about 0.5 of a thickness of the first and second sacrificial films, respectively.

Forming the first and second mask patterns may include depositing at least one of SiON, $SiO_2$, $Si_3N_4$, SiCN, and polysilicon.

Patterning the first sacrificial film may include forming a first sacrificial pattern with first portions parallel to one another and second portions spaced apart from one another between adjacent first portions, top surfaces of the first portions being lower than top surfaces of the second portions.

The method may further include forming lower holes under the upper holes by patterning the lower film using the first sacrificial pattern.

Forming the lower film may include forming word lines and bit lines crossing the word lines, forming MOS transistors using the word lines as gate electrodes in the cell region, and forming contact plugs electrically connected to the MOS transistors by filling the lower holes with a conductive material.

Forming the lower holes may include forming holes with an aspect ratio of about 2:1 to about 16:1.

Forming the lower holes may include forming holes with a width of about 10 nm to about 40 nm.

According to other example embodiments, a method of manufacturing a semiconductor device may include forming a first sacrificial film on a lower film including a cell region and a peripheral circuit region, forming first mask patterns on the first sacrificial film in the cell region, forming trenches in the cell region of the first sacrificial film by patterning the first sacrificial film using the first mask patterns, forming second sacrificial patterns crossing the first mask patterns and covering the first sacrificial film of the peripheral circuit region, and forming a first sacrificial pattern having upper holes exposing the lower film in the trenches by patterning the first sacrificial film using the first mask patterns and the second sacrificial patterns.

According to other example embodiments, a method of manufacturing a semiconductor device may include forming a first sacrificial film on a lower film including a cell region and a peripheral circuit region, forming trenches in the cell region of the first sacrificial film, such that the trenches are spaced apart from each other and extend along a top surface of the lower film, forming a second sacrificial film on the first sacrificial film, such that the second sacrificial film fills the trenches in the first sacrificial film and covers a top surface of the first sacrificial film, patterning the second sacrificial film to form second sacrificial patterns spaced apart from each other and crossing the trenches in the first sacrificial film, patterning the first sacrificial film using the second sacrificial patterns as a mask to expose portions of the top surface of the lower film, and patterning the lower film exposed through the patterned first sacrificial film.

Forming the first and second sacrificial films may include depositing a material including about 80% by weight to about 99% by weight of carbon, based on a total weight of each of the first and second sacrificial films.

Forming the first and second sacrificial films may include depositing a material consisting essentially of carbon.

Patterning the first sacrificial film may include forming a grid with holes exposing portions of the top surface of the lower film, the grid including first portions defined by segments of the first sacrificial film between the trenches along the first direction and second portions defined by the second sacrificial patterns along the second direction.

Forming the first portions may include forming linear portions spaced apart from each other along the second direction, and forming the second portions may include forming segments spaced apart from each other along the first and second directions, the second portions being shorter than the first portions relative to the lower film.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION OF THE EMBODIMENTS

Figure 1:
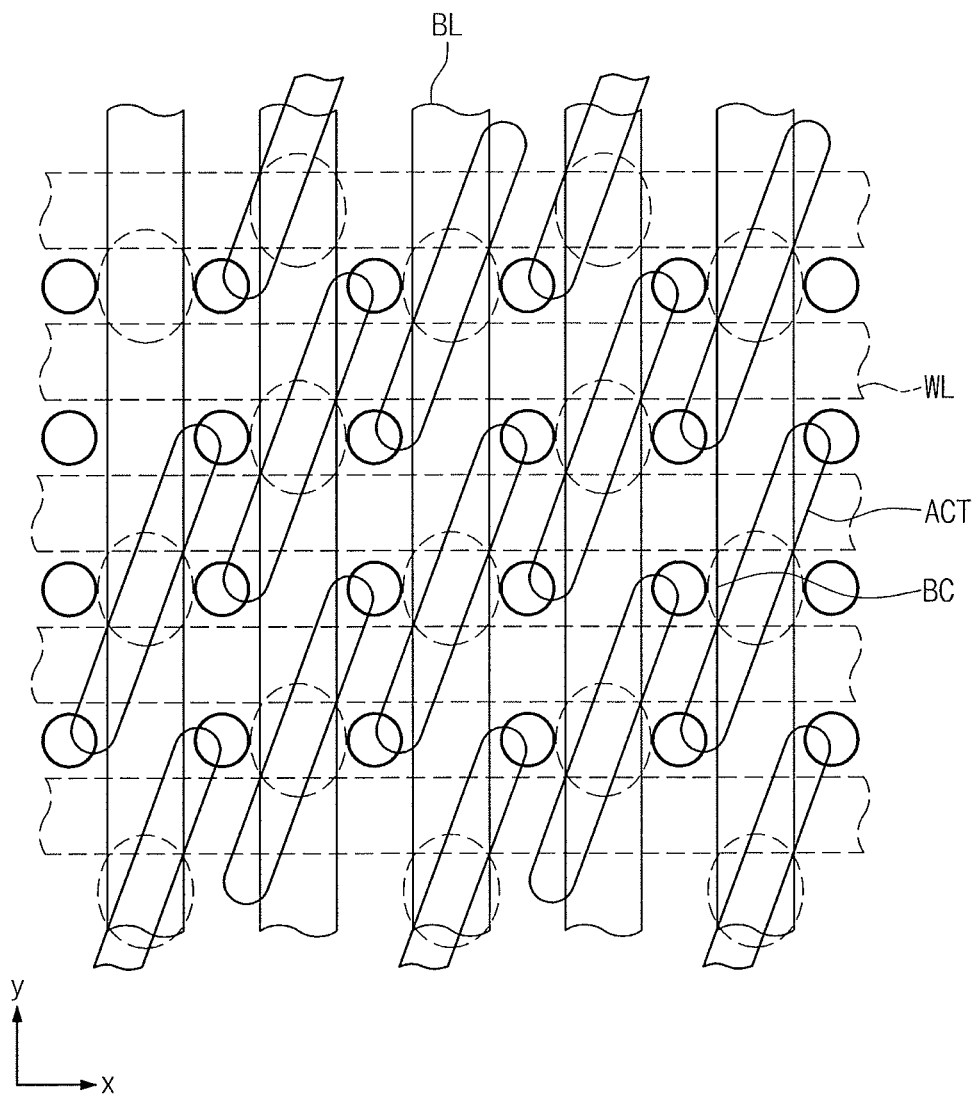
FIG. 1 illustrates a top plan view of a cell area of a semiconductor device in accordance with an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Further, as used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments of the inventive concept may be described with reference to illustrations, which are schematic illustrations of idealized embodiments. As such, variations from the shapes of the illustrations, as a result, for example, of manufacturing techniques and/or tolerances, are to be expected. Thus, embodiments should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the example embodiments.

In embodiments of the inventive concept, a semiconductor device may be constituted by a same kind of semiconductor device or may be a single chip data processing device such as a system on chip (SOC) constituted by different kinds of semiconductor devices needed to provide a full function.

FIG. 1 is a top plan view illustrating a cell area of a semiconductor device in accordance with an embodiment. FIGS. 2 through 11 are drawings illustrating stages in a method of manufacturing a semiconductor device in accordance with an embodiment.

Figure 2:
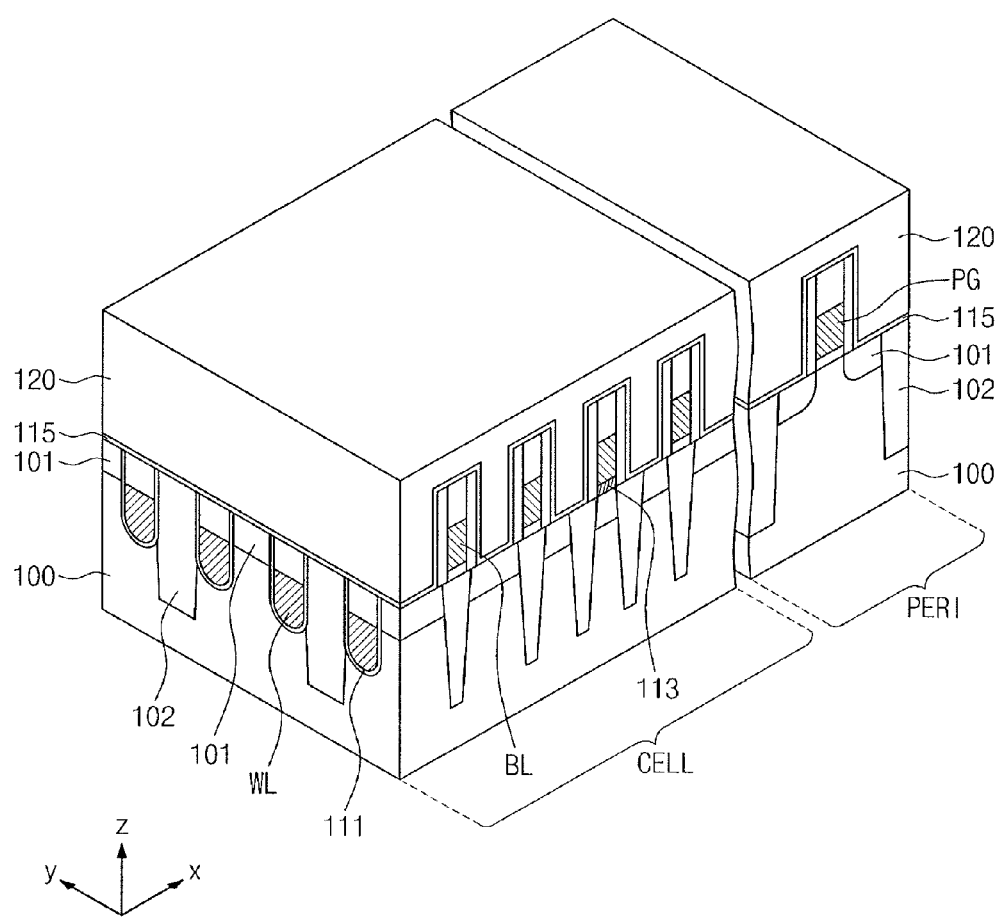
FIGS. 2 through 11 illustrate perspective views of stages in a method of manufacturing a semiconductor device in accordance with an embodiment.

Referring to FIGS. 1 and 2, a substrate 100 is provided. The substrate 100 may include a cell region CELL, i.e., a region in which memory cells are integrated, and a peripheral circuit region PERI, i.e., a region in which peripheral circuits controlling memory cells are integrated. The substrate 100 may be, e.g., at least one of a silicon substrate, a silicon-on-insulator (SOI) substrate, a germanium substrate, a germanium-on-insulator (GOI) substrate, a silicon-germanium substrate, and a substrate of epitaxial thin film obtained by performing a selective epitaxial growth (SEG).

A high integration semiconductor memory device, e.g., at least one of a dynamic random access memory (DRAM), a static random access memory (SRAM), a resistance RAM (RRAM), a magnetic RAM (MRAM), a ferroelectric RAM (FRAM), and a flash memory, may be formed on the substrate 100 of the cell region CELL. For example, a DRAM device may be formed on the substrate 100 of the cell region CELL. In another example, a micro electro mechanical system (MEMS) device, an optoelectronic device, or a processor, e.g., CPU or DSP, may be formed on the substrate 100. That is, word lines WL and bit lines BL crossing the word lines WL may be formed on the substrate 100 of the cell region CELL, so MOS transistors using a word line as a gate electrode may be formed on the substrate 100 of the cell region CELL.

According to an embodiment, recess regions may be formed in the substrate 100 of the cell region CELL. The recess regions may be recessed by a predetermined depth from a surface of the substrate 100 and may be disposed to cross an active region. A gate insulating film 111 and the word line WL are formed in the recess region, and the word lines WL may be buried in the recess region. That is, a top surface of the word line WL may be lower than a top surface of the substrate 100. The recess region, in which the word line WL is formed, may be filled with an insulating material. Source and drain regions 101 may be formed in active regions of both sides of the word line WL. The source and drain regions 101 may be impurity regions doped with an impurity. Also, the source and drain regions 101 may be an epitaxial layer doped with an impurity, and the epitaxial layer may be elevated from a surface of the substrate 100. A plurality of field effect transistors may be formed in the substrate 100 by forming the word lines WL and the source and drain regions 101.

Bit lines BL crossing the word lines WL may be formed on the substrate 100 in which the word lines WL are formed. The bit lines BL may be formed on the substrate 100, and an insulating film may be interposed between the substrate 100 and the bit line BL. Conductive patterns 113, electrically connecting the source and drain regions 101 to the bit lines BL, may be formed between the active region ACT and the bit line BL. A device isolation region 102 may be formed in the substrate 100.

A peripheral gate electrode PG may be formed on the substrate 100 of the peripheral circuit region PERI. The peripheral gate electrode PG may have a structure such that a gate insulating film, a gate conductive pattern, and a capping film are sequentially stacked. Sidewall spacers may be formed on both sides of the peripheral gate electrode PG. Also, the source and drain regions 101 may be formed on an active region of both sides of the peripheral gate electrode PG.

A first interlayer insulating film 120 may be formed on the substrate 100 including the word lines WL, the bit lines BL, and the peripheral gate electrodes PG. The first interlayer insulating film 120 may be formed by depositing an insulating material, followed by planarizing a top surface of the insulating material. The first interlayer insulating film 120 may include, e.g., at least one of a HDP oxide film, tetra ethyl ortho silicate (TEOS), plasma enhanced TEOS, $O_3$-TEOS, BSG, BPSG, FSG, SOG, and TOSZ. Also, the first interlayer insulating film 120 may include silicon nitride, silicon oxynitride, or low-k material having a low dielectric constant.

Before forming the first interlayer insulating film 120, an etch-stop film 115 may be formed to conformally cover the substrate 100 including the bit lines BL and the peripheral gate electrodes PG. The etch-stop film 115 may be formed from a material having an etching selectivity with respect to the first interlayer insulating film 120. For example, the etch-stop film 115 may be formed from a silicon nitride film or a silicon oxynitride film.

Subsequently, contact holes of fine pattern may be formed in the first interlayer insulating film 120. In an embodiment, forming contact holes may include forming a mask structure of a material including carbon on the first interlayer insulating film 120, followed by patterning the first interlayer insulating film 120 using the mask structure. Hereinafter, with reference to FIGS. 3 through 9, a method of forming such contact holes using a mask structure will be described in detail.

Figure 3:
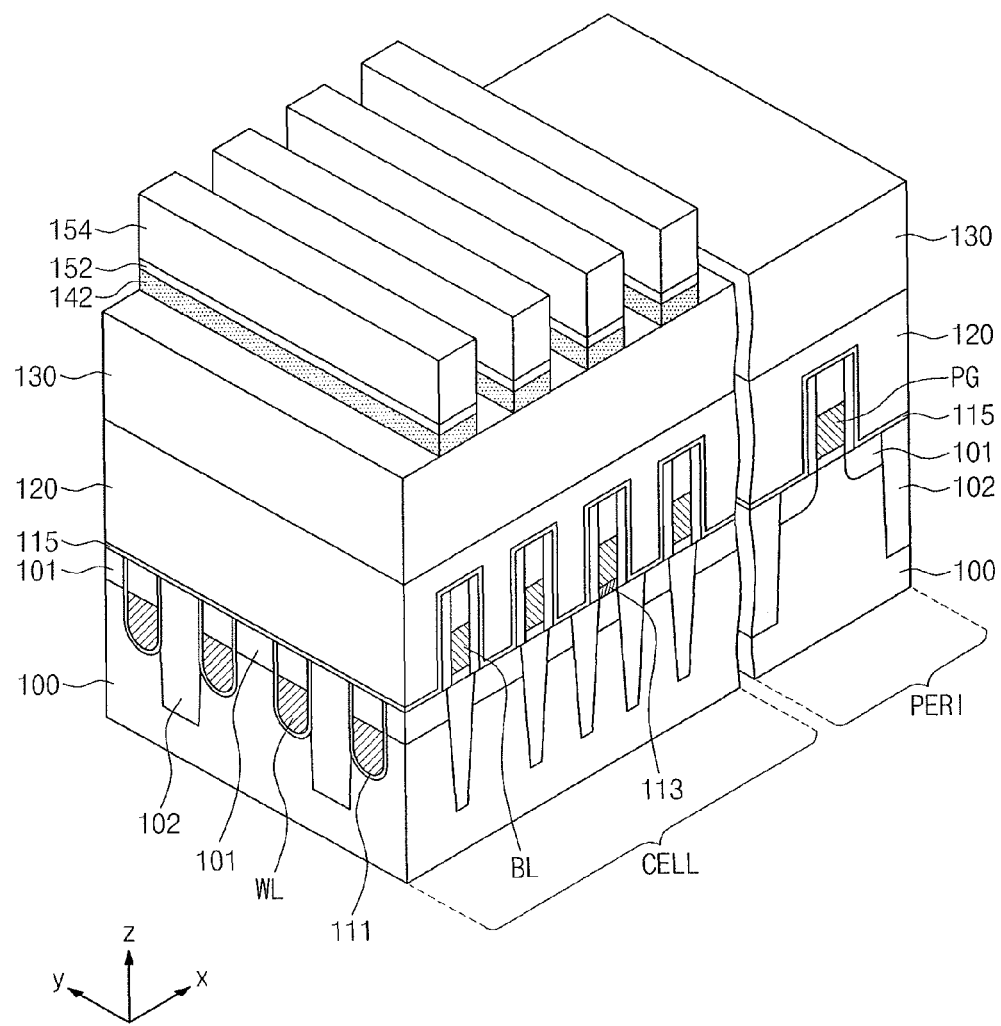

Referring to FIG. 3, a first sacrificial film 130 may be formed on the first interlayer insulating film 120.

The first sacrificial film 130 may be formed from material having an etching selectivity with respect to the first interlayer insulating film 120 in a process of etching the first interlayer insulating film 120. According to an embodiment, the first sacrificial film 130 may be formed of a material having carbon as a main ingredient, e.g., the first sacrificial film 130 may consist essentially of carbon. For example, the first sacrificial film 130 may include a film having a relatively high carbon content of about 80% by weight to about 99% by weight, based on gross weight of compound constituting the first sacrificial film 130, i.e., based on a total weight of the first sacrificial film 130. Also, the first sacrificial film 130 may be deposited on the first interlayer insulating film 120 using a chemical vapor deposition (CVD) and may have a thickness of about 1000 Å to about 10000 Å. According to an embodiment, the first sacrificial film 130 may be an amorphous carbon layer formed using a CVD.

Referring to FIG. 3, first mask patterns 142 for forming trenches may be formed on the first sacrificial film 130. According to an embodiment, the first mask patterns 142 may be parallel to the word lines WL or the bit lines BL on the first sacrificial film 130 of the cell region CELL. For example, as illustrated in FIG. 3, the first mask patterns 142 may be formed to be parallel to the bit lines BL. Also, the first mask patterns 142 may be disposed on the same vertical line as the bit lines BL. That is, the first mask patterns 142 may overlap the bit lines BL when viewed from a top plan view. According to the present embodiment, the first mask patterns 142 may extend along an entire width of the first sacrificial film 130, e.g., along the y-axis. The first mask patterns 142 may be formed from a material having an etching selectivity of more than about 10:1 in a process of etching the first sacrificial film 130. As a result, in a process of etching the first sacrificial film 130, an etching speed of the first sacrificial film 130 may be substantially greater than an etching speed of the first mask patterns 142.

In detail, forming the first mask patterns 142 may include forming a first mask layer (not shown) on the first sacrificial film 130, forming first photoresist patterns 154 on the first mask layer, and etching the first mask layer using the first photoresist patterns 154 to form the first mask patterns 142. Also, a first reflection prevention pattern 152 may be formed between the first mask layer and the first photoresist pattern 154.

In detail, the first mask layer may be formed from a material having an etching selectivity of more than about 10:1 in a process of etching the first sacrificial film 130. For example, the first mask layer may be at least one of SiON, $SiO_2$, $Si_3N_4$, SiCN, polysilicon, etc. The first mask layer may be formed using a deposition method, e.g., a CVD or a spin coating. A thickness of the first mask layer may be about 0.1 to about 0.5 of a thickness of the first sacrificial film 130, i.e., along the z-axis. For example, the first mask layer may be deposited to a thickness of about 300 Å to about 600 Å on, e.g., directly on, the first sacrificial film 130 using CVD.

The first photoresist patterns 154 may be formed by spreading a resist material on the first mask layer to form a first photoresist layer, and then performing an exposure process and a development process on the first photoresist layer to form the first photoresist patterns 154 on the first mask layer. For example, a photolithography process for forming a line and space pattern, i.e., lines spaced apart from each other, may be performed on the first photoresist layer of the cell region CELL to form the first photoresist patterns 154 on the first mask layer. The photolithography process may include an exposure process using fluoride krypton (KrF) laser, fluoride argon (ArF) laser, fluorine ($F_2$) laser, or an extreme ultraviolet (EUV) light. It is noted that embodiments are not limited to first photoresist patterns 154 having a structure of linear lines spaced apart from each other, e.g., the first photoresist patterns 154 may be curved, e.g., shaped as ellipses, or have any other suitable geometrical shape.

The first reflection prevention pattern 152 may have an etching selectivity with respect to the first mask layer and may be formed from a material preventing light reflection by absorbing light during the exposure process. The first reflection prevention pattern 152 may include an organic compound or an inorganic compound. According to an embodiment, the first reflection prevention pattern 152 may be formed from an organic material having an etching characteristic similar to that of a photoresist. Forming the first reflection prevention pattern 152 may include coating a first reflection prevention film on the first mask layer using a spin-on coating method, performing a bake process hardening the coated first reflection prevention film, and etching the first reflection prevention film using the first photoresist patterns 154. By forming the first reflection prevention patterns 152 between the first mask layer and the first photoresist patterns 154, when a photolithography process for forming the first photoresist patterns 154 is performed, variation of a line width of the first photoresist pattern 154 by reflection and scattering of light irradiated into a photoresist layer may be prevented or substantially minimized.

Next, the first mask layer on the first sacrificial film 130 may be etched using the first photoresist patterns 154 and the first reflection prevention patterns 152. Thus, the first mask patterns 142, e.g., having a structure of lines parallel to each other and spaced apart from each other a predetermined distance, may be formed on the first sacrificial film 130. According to an embodiment, a distance between the first mask patterns 142, e.g., a distance between adjacent first mask patterns 142 along the x-axis, may be greater than a width of the first mask patterns 142, e.g., along the x-axis. Also, the distance between the first mask patterns 142 may be equal to or less than twice the width of the first mask patterns 142.

Figure 4:
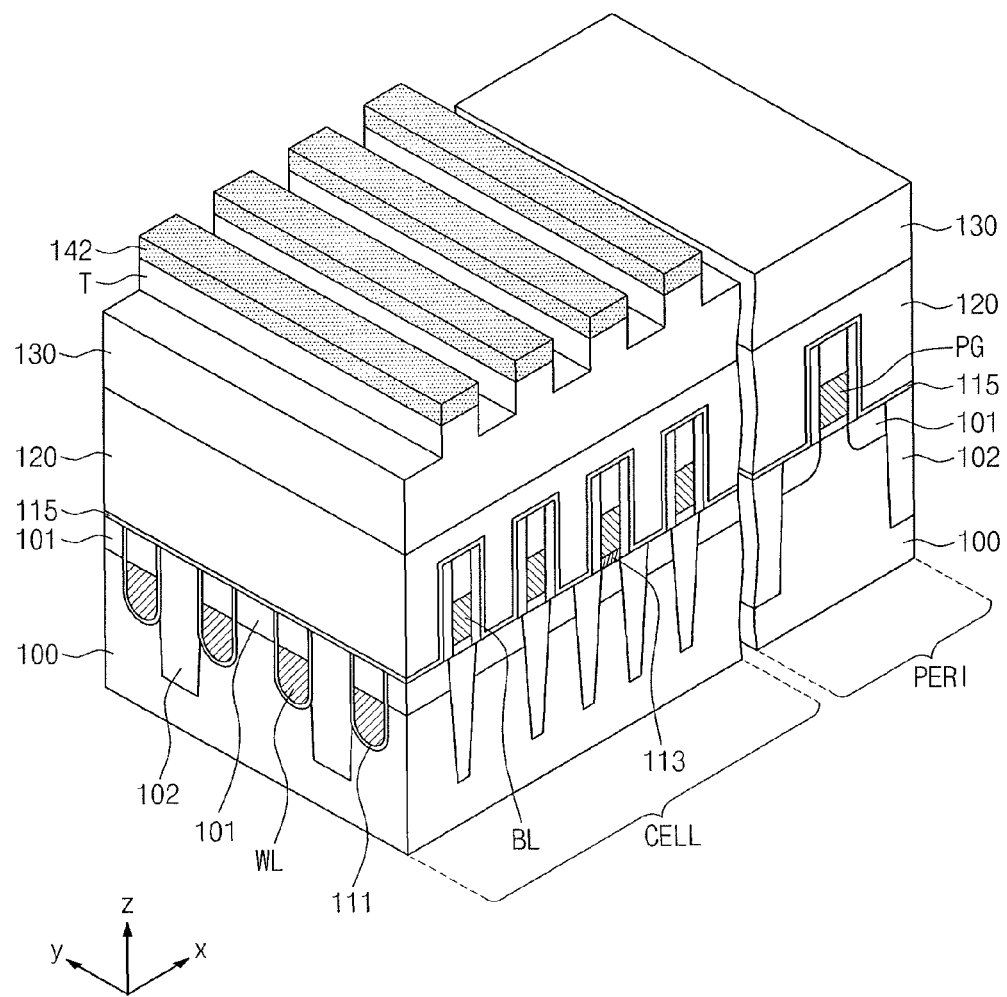

Referring to FIG. 4, a part of the first sacrificial film 130 may be etched using the first mask patterns 142 to form trenches T on the first sacrificial film 130. That is, a top surface of the first sacrificial film 130 exposed by the first mask patterns 142 may be recessed by forming the trenches T on the first sacrificial film 130.

In an embodiment, the trenches T may have a line shape and a width of the trench T may be greater than a width of the first mask pattern 142. That is, a space between the trenches T, i.e., a width of the first mask pattern 142, may be smaller than a width of the trench T. For example, a width of the trench T may be two times as long as a width of the first mask pattern 142. A depth of the trench T may be equal to or greater than a thickness of the first mask pattern 142, e.g., about 200 Å to about 300 Å. Since the first mask patterns 142 are not located on the peripheral circuit region PERI, a top surface of the first sacrificial film 130 covering the peripheral circuit region PERI may be recessed. According to another embodiment, a process of etching the first sacrificial film 130 using the first mask patterns 142 may be performed until the first interlayer insulating film 120 is exposed. Thus, first sacrificial patterns of a line shape substantially parallel to the bit lines BL may be formed on the first interlayer insulating film 120 of the peripheral circuit region PERI.

Forming the trenches T may include etching a part of the first sacrificial film 130 using the first mask patterns 142 as an etching mask. An anisotropic etching, such as an etch-back process, may be used as a process of etching the first sacrificial film 130 to form the trenches T. For example, the first sacrificial film 130 may be etched using an etching gas of a fluorine system, e.g., a mixture gas of an etching gas of fluorine system and $O_2$ or a mixture gas of an etching gas of fluorine system, $O_2$, and Ar may be used in a process of anisotropically etching the first sacrificial film 130. Examples of an etching gas of a fluorine system may include $C_3F_6$, $C_4F_6$, $C_4F_8$, or $C_5F_8$. Also, $O_2$ gas provided together with an etching gas of fluorine system may remove a polymer residual product generated during an etching process. Ar gas is a carrier gas and generates an ion collision. A process of performing a dry etching on the first sacrificial film 130 may be performed at a DC voltage of about 50 V to about 200 V, at a temperature of 60° C. or less and at a flow rate of about 2000 sccm or less. According to an embodiment, a process of performing a dry etching on the first sacrificial film 130 may be performed under a plasma atmosphere by generating plasma of an etching gas. For example, a dry plasma etching process may be performed using a plasma etching facility of an inductively coupled plasma (ICP) method or a dual frequency capacitively coupled plasma (CCP) method.

While forming the trenches T on the first sacrificial film 130, the first photoresist patterns 154 and the first reflection prevention patterns 152 on the first mask patterns 142 may be removed by an etching process of forming the trenches T.

Figure 5:
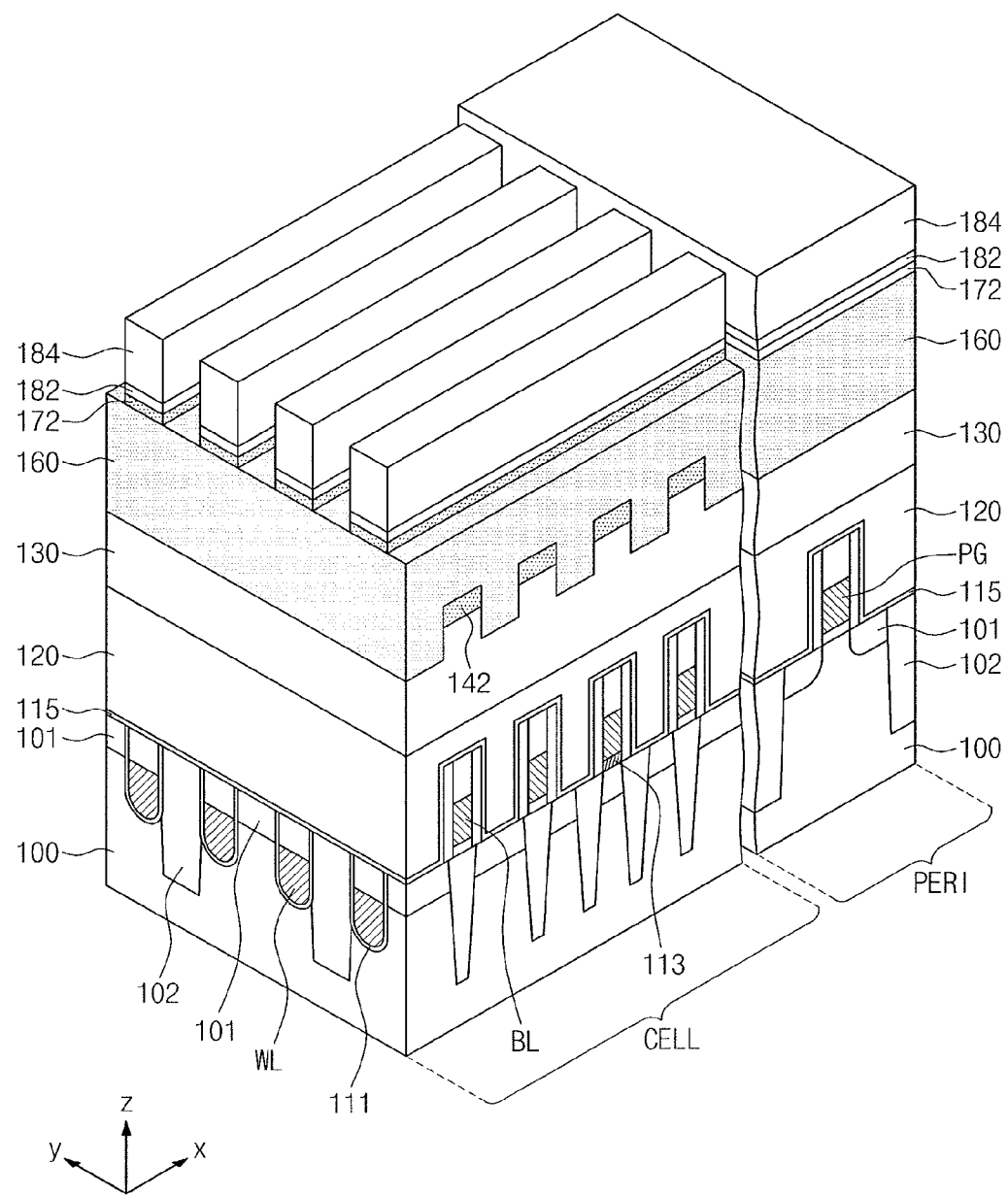

Referring to FIG. 5, a second sacrificial film 160 filling the trenches T formed on the first sacrificial film 130 may be formed on the cell region CELL and the peripheral circuit region PERI.

The second sacrificial film 160 may be formed using a spin-on coating method and may be formed from a material having an etching selectivity with respect to the first interlayer insulating film 120 and the first mask patterns 142 in a process of etching the first interlayer insulating film 120 and the first mask patterns 142. More specifically, the second sacrificial film 160 may be formed from a material having carbon as a main ingredient, e.g., the second sacrificial film 160 may consist essentially of carbon. According to an embodiment, the second sacrificial film 160 may be constituted by a film having a comparatively high carbon content of about 80% by weight to about 90% by weight, based on a gross weight of the material constituting the second sacrificial film 160. According to an embodiment, the second sacrificial film 160 may be formed by coating the second sacrificial film 160 to a thickness of about 800 Å to about 1000 Å on the first mask patterns 142 and then baking the second sacrificial film 160 at a temperature of about 100° C. to about 500° C. for about 30 sec to about 300 sec. At this time, the bake process may be performed once or more at a different temperature condition.

Since the second sacrificial film 160 may fill the trenches T formed on the first sacrificial film 130 and may be formed by a spin-on coating method, a roughness of a top surface of the second sacrificial film 160 may be small. That is, the second sacrificial film 160 may have a substantially flat top surface while filling the trenches T of the first sacrificial film 130. The second sacrificial film 160 may be coated with a thickness greater than the depth of the trench T. For example, the second sacrificial film 160 may have a thickness of about 800 Å to about 1000 Å on the first mask patterns 142, i.e., as measured from a top surface of the first mask patterns 142. Since the second sacrificial film 160 is formed on the first sacrificial film 130, on which the trenches T are formed, using the spin-on coating method, the second sacrificial film 160 may not be affected by a profile of the first sacrificial film 130, i.e., by the trenches T, and may have a flat top surface.

Referring to FIG. 5, second mask patterns 172 may be formed on the flat top surface of the second sacrificial film 160. According to an embodiment, the second mask patterns 172 may be formed to cross the first mask patterns 142 on the second sacrificial film 160 of the cell region CELL. In an embodiment, the second patterns 172 may be parallel to the word lines WL. The second mask patterns 172 may also overlap the word lines WL when viewed from a top plan view. That is, the second mask patterns 172 may be spaced a predetermined distance apart from one another on the cell region CELL and a space between the second mask patterns 172 may be equal to or greater than a width of the second mask pattern 172, e.g., a space between the second mask patterns 172 may be equal to or less than two times a width of the second mask pattern 172. The width of the second mask pattern 172 may be a minimum width of a pitch that can be embodied by a photolithography process. A pitch of the second mask patterns 172 may be substantially the same as a pitch of the first mask patterns 142. Also, a width of the second mask pattern 172, e.g., along the y-axis, may be substantially the same as a width of the first mask pattern 142, e.g., along the x-axis. The second mask patterns 172 may cover an entire surface of the second sacrificial film 160 on the peripheral circuit region PERI. That is, the second sacrificial film 160 is not exposed on the peripheral circuit region PERI.

In an embodiment, forming the second mask patterns 172 may include forming a second mask layer (not illustrated) on an entire surface of the second sacrificial film 160 and forming second photoresist patterns 184 on the second mask layer to pattern the second mask layer. Further, a second reflection prevention pattern 182 may be formed between the second mask pattern 172 and the second photoresist patterns 184.

More specifically, the second mask layer may be formed using a deposition method, such as a CVD method, and may be formed from a material having an etching selectivity with respect to the first and second sacrificial films 130 and 160 in a process of etching spaces in the second mask layer to form the second mask patterns 172. For example, the second mask layer may be formed from a material containing silicon, e.g., one or more of SiON, $SiO_2$, $Si_3N_4$, SiCN, polysilicon etc. According to an embodiment, the second mask layer may be formed from the same material as the first mask pattern 142. Alternatively, the second mask layer may be formed from a material having an etching selectivity with respect to the first mask pattern 142 while etching the second mask layer. A thickness of the second mask layer may be about 0.1 to about 0.5 of a thickness of the second sacrificial film 160. For example, the second mask layer may be deposited to a thickness of about 200 Å to about 400 Å on the second sacrificial film 160 using a CVD method.

In an embodiment, the second photoresist patterns 184 may be patterns of a line shape crossing the first mask patterns 142. A pitch of the second photoresist patterns 184 may be substantially the same as a pitch of the first photoresist patterns 154. The second photoresist patterns 184 may be formed by spreading a resist material on the second mask layer to form a second photoresist layer and then performing an exposure process and a development process on the second photoresist layer. For example, the second photoresist pattern 184 may be formed by an exposure process using KrF laser, ArF laser, $F_2$ laser, or an EUV light.

The second reflection prevention pattern 182 may have an etching selectivity with respect to the second mask layer and may be formed from a material preventing light reflection by absorbing light when an exposure process is performed. The second reflection prevention pattern 152 may include an organic compound or an inorganic compound. According to an embodiment, the second reflection prevention pattern 182 may be formed from an organic material having an etching characteristic similar to that of a photoresist. Forming the second reflection prevention pattern 182 may include coating a second reflection prevention film on the second mask layer using a spin-on coating method, performing a bake process hardening the coated second reflection prevention film, and etching the second reflection prevention film using the second photoresist patterns 184. By forming the second reflection prevention patterns 182 between the second mask layer and the second photoresist patterns 184, when a photolithography process for forming the second photoresist patterns 184 is performed, width variation of the second photoresist patterns 184 due to reflection and scattering of light irradiated into a photoresist layer may be prevented or substantially minimized.

Subsequently, the second mask patterns 172 may be formed using the second photoresist patterns 184 and the second reflection prevention patterns 182. The second mask patterns 172 may be formed by anisotropically etching the second mask layer until the second sacrificial film 160 is exposed.

Figure 6:
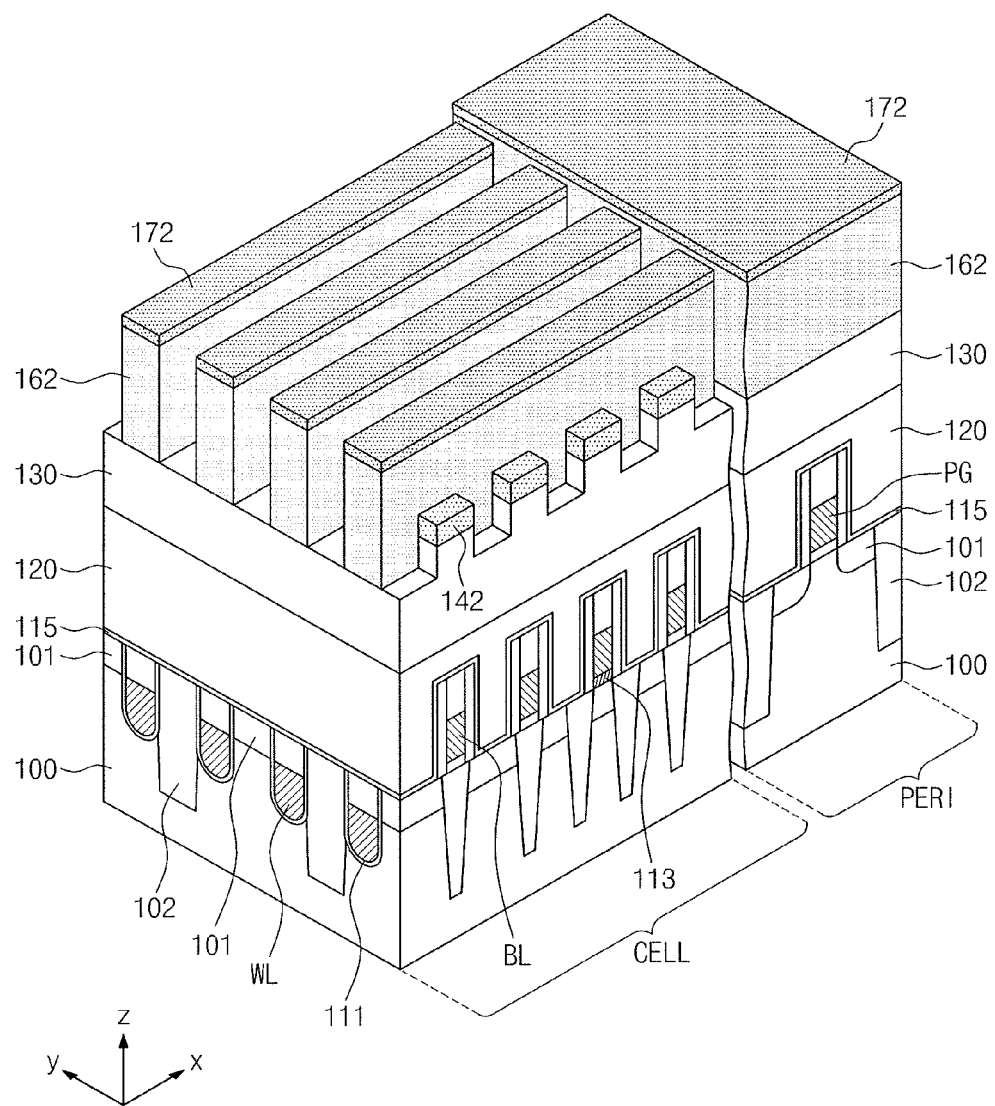

Referring to FIG. 6, second sacrificial patterns 162 may be formed by patterning the second sacrificial film 160 to expose the first sacrificial film 130 using the second mask patterns 172. More specifically, when etching the second sacrificial film 60 using the second mask patterns 172, as illustrated in FIG. 6, top surfaces of the first mask patterns 142 may be exposed between the second mask patterns 172. Also, a bottom surface of the trench T defined on the first sacrificial film 130 may be exposed between the second mask patterns 142. The second sacrificial patterns 162 may cross the trenches T and the first mask patterns 142 formed on the first sacrificial film 130 in the cell region CELL. A space between the second sacrificial patterns 162 in the cell region CELL may be substantially the same as a space between the first mask patterns 142. When forming the second sacrificial patterns 162, the second sacrificial film 160 on the peripheral circuit region PERI may be covered, e.g., completely covered, with the second mask pattern 172. Therefore, the first sacrificial film 160 of the peripheral circuit region PERI may not be exposed.

In an embodiment, an anisotropic etching process, such as an etch-back process, may be used as a process of etching the second sacrificial film 160. At this time, the second sacrificial film 160 having carbon as a main ingredient may be etched using an etching gas of fluorine system. More specifically, a mixture gas of an etching gas of fluorine system and $O_2$ or a mixture gas of an etching gas of fluorine system, $O_2$, and Ar may be used in a process of anisotropically etching the second sacrificial film 160. Here, $C_3F_6$, $C_4F_6$, $C_4F_8$ or $C_5F_8$ may be used as an etching gas of fluorine system. Also, $O_2$ gas provided together with an etching gas of fluorine system may remove a polymer residual product generated during an etching process. Ar gas is a carrier gas and generates an ion collision. A process of performing a dry etching on the second sacrificial film 160 may be performed at a DC voltage of about 50 V to about 200 V, at a temperature of 60° C. or less and at a flow rate of about 2000 sccm or less. According to an embodiment, a process of performing a dry etching on the second sacrificial film 160 may be performed under a plasma atmosphere by generating plasma of an etching gas. For example, a dry plasma etching process may be performed using a plasma etching facility of an ICP method or a dual frequency CCP method.

The second photoresist patterns 184 and the second reflection prevention patterns 182 may be removed while etching the second sacrificial film 160.

Figure 7:
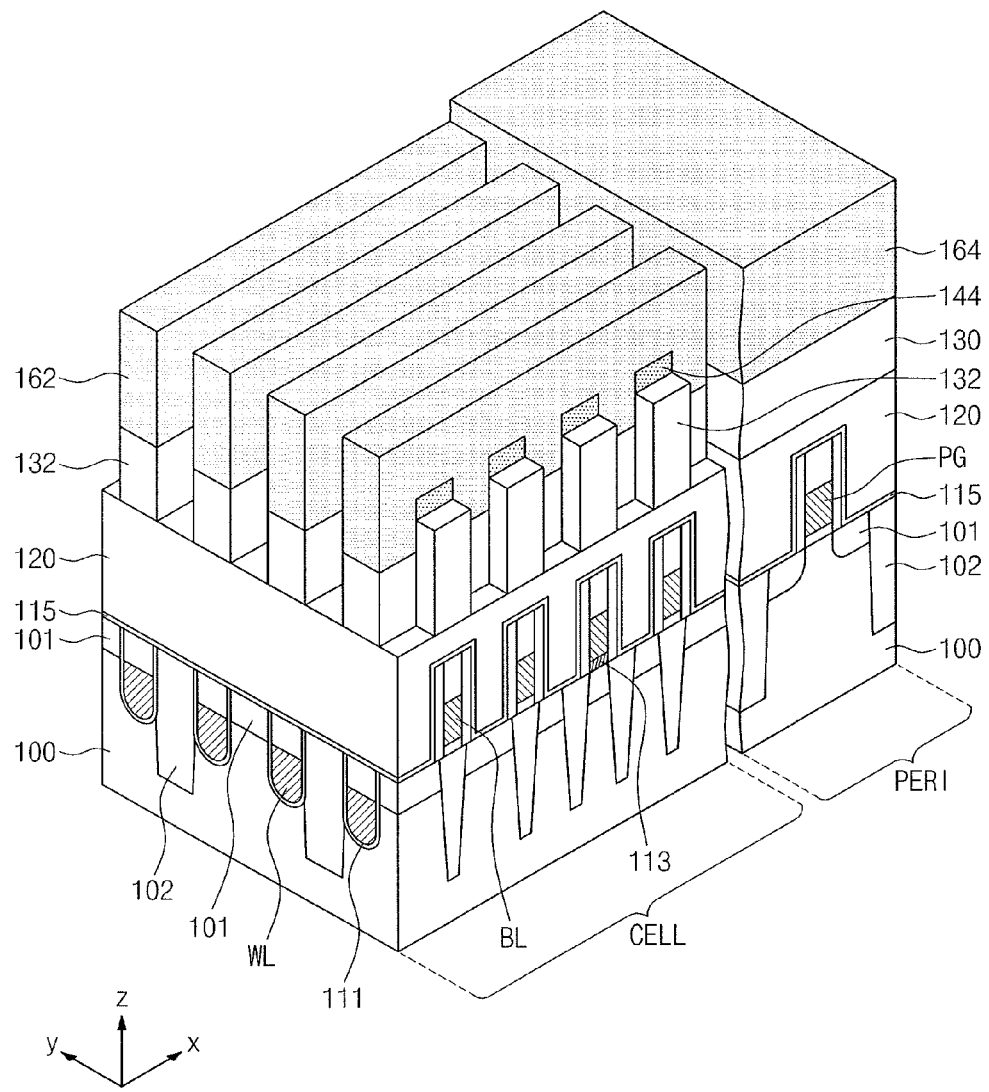

Referring to FIG. 7, the first sacrificial film 130 may be patterned using the first and second mask patterns 142 and 172. As a result, a first sacrificial pattern 132 may be formed on the first interlayer insulating film 120.

Figure 8:
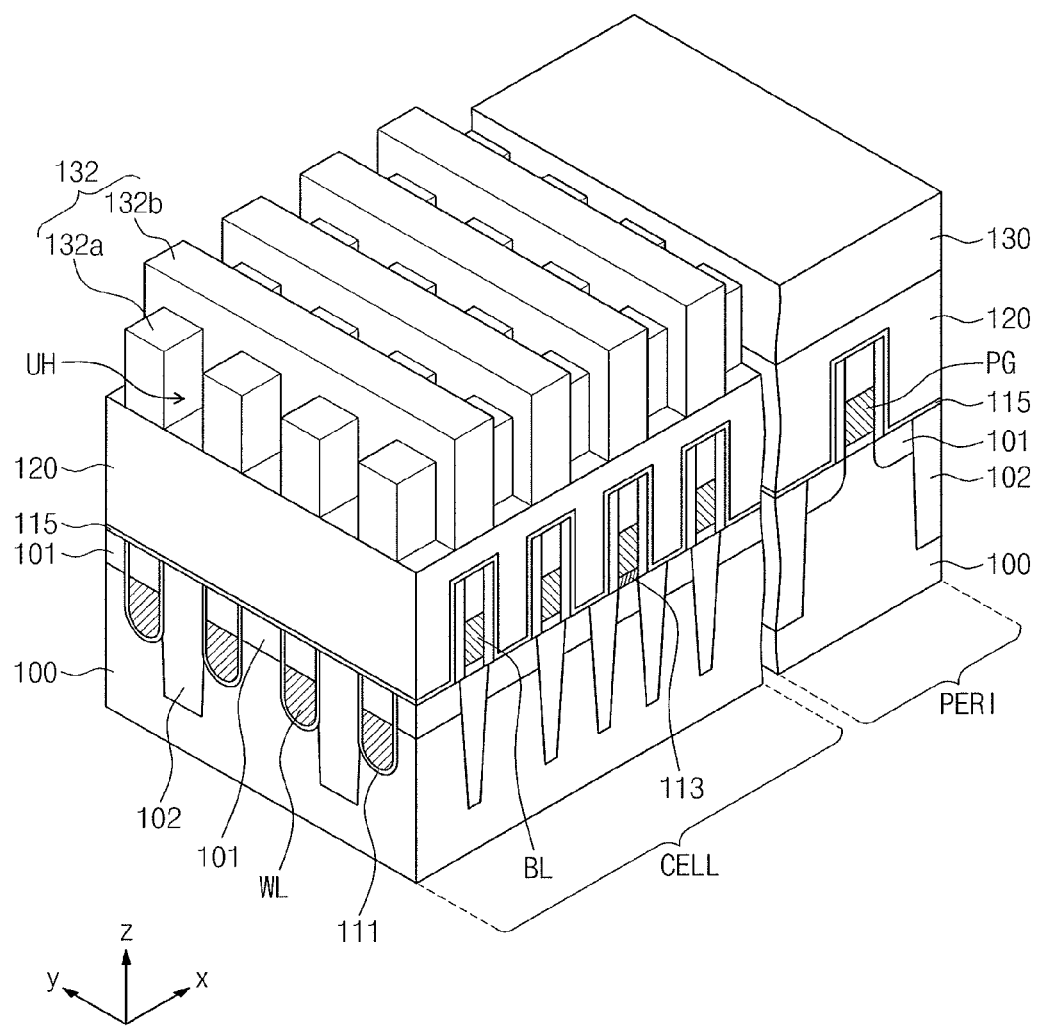

More specifically, forming the first sacrificial pattern 132 may include anisotropically etching a top surface of the first sacrificial film 130 exposed by the first and second mask patterns 142 and 172. As illustrated in FIG. 8, the first sacrificial pattern 132 defining upper holes UH exposing the first interlayer insulating film 120 may be formed by anisotropically etching the first sacrificial film 130. According to an embodiment, the first sacrificial pattern 132 may be formed by continuously performing an etching process of forming the second sacrificial pattern 162 until the first interlayer insulating film 120 is exposed.

In a process of forming the first sacrificial pattern 132, the first and second mask patterns 142 and 172 may have an etching selectivity of about 10:1 or more with respect to the first and second sacrificial patterns 132 and 162. Thus, the upper holes UH having a fine width while maintaining a thickness of the first sacrificial film 130 may be formed. That is, the first sacrificial pattern 132 having the upper holes UH of a great aspect ratio may be formed using the first and second mask patterns 142 and 172 having a small thickness.

Since the first and second mask patterns 142 and 172 may have a high etching selectivity of about 10:1 or more with respect to the first and second sacrificial patterns 132 and 162, it may be prevented that adjacent upper holes UH are connected to each other or the first interlayer insulating film 120 is not exposed by the upper holes UH when forming the first sacrificial pattern 132.

After forming the first sacrificial pattern 132, the first and second mask patterns 142 and 172, as well as the second sacrificial patterns 162, may be performed. The first and second mask patterns 142 and 172 may be removed by a dry etching process or a wet etching process. At this time, the first and second mask patterns 142 and 172 may have a high etching selectivity with respect to the first and second sacrificial patterns 132 and 162, so the first and second mask patterns 142 and 172 may be selectively etched from the first and second sacrificial patterns 132 and 162. In the case that the first and second mask patterns 142 and 172 are formed from a same material, the first and second mask patterns 142 and 172 may be simultaneously etched by an etching process. Also, a part of the first interlayer insulating film 120 exposed by the first and second sacrificial patterns 132 and 162 may be etched during the removal of the first and second mask patterns 142 and 172.

According to an embodiment, when removing the first and second mask patterns 142 and 172, since the second sacrificial pattern 162 is located between the first mask pattern 142 and the second mask pattern 172, a part 144 of the first mask pattern 142 may locally remain under the second sacrificial pattern 162.

Subsequently, a process of removing the second sacrificial patterns 162 and 164 covering the cell region CELL and the peripheral circuit region PERI and a process of removing the part 144 of the first mask pattern 142 locally remaining under the second sacrificial patterns 162 may be sequentially performed. Thus, as illustrated in FIG. 8, the first sacrificial pattern 132 defining upper holes UH may be formed on the first interlayer insulating film 120.

More specifically, the first sacrificial pattern 132 may include a first portion 132a parallel to the word lines WL and a second portion 132b parallel to the bit lines BL. Here, a top surface of the second portion 132b may be higher than a top surface of the first portion 132a. That is, a height difference between the first and second portions 132a and 132b may exist.

Figure 9:
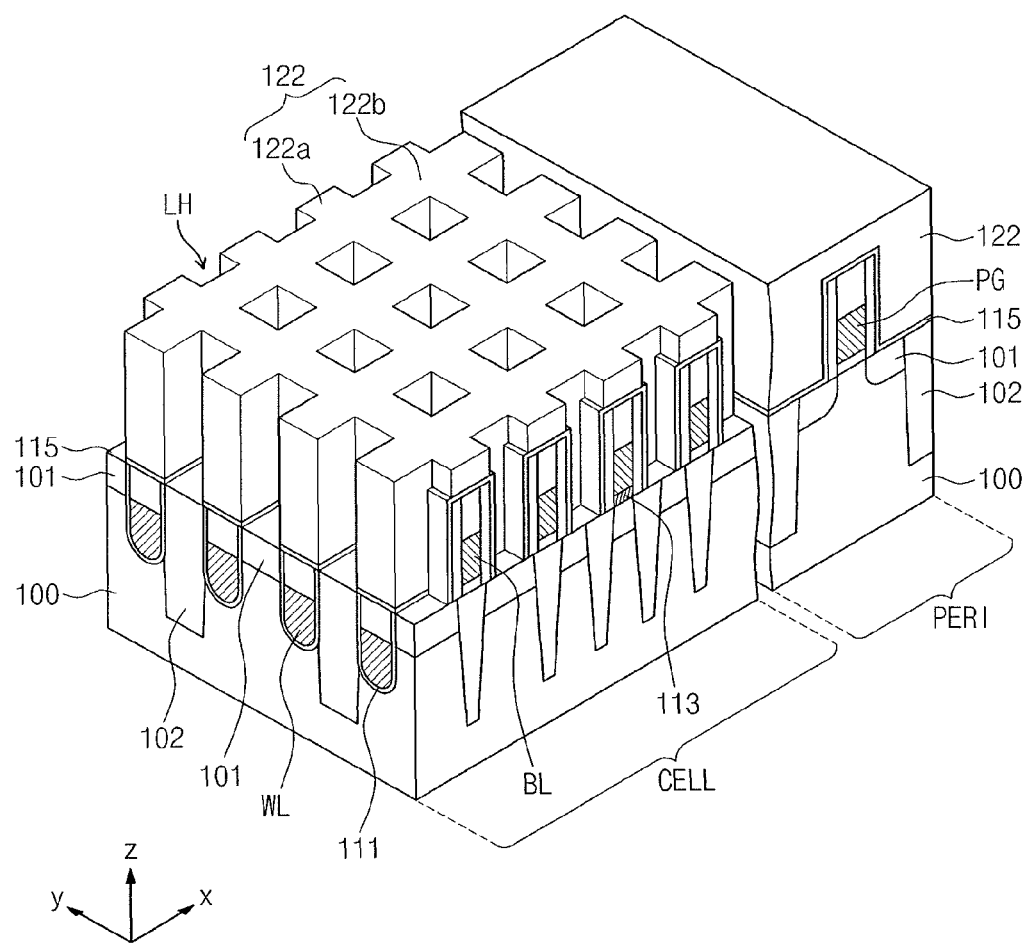

Referring to FIG. 9, the first interlayer insulating film 120 is patterned using the first sacrificial pattern 132 as an etching mask. Since the first sacrificial pattern 132 having carbon as a main ingredient has a superior etching tolerance, i.e., a superior etching selectivity, collapse or thickness reduction of the first sacrificial pattern 132 during etching of the first interlayer insulating film 120 may be prevented or substantially minimized. Therefore, lower contact holes LH having a fine width and a great aspect ratio may be stably formed using the first sacrificial pattern 132 defining the upper holes UH.

In detail, as the first interlayer insulating film 120 is patterned, the upper holes UH formed in the first sacrificial pattern 132 may be transferred to the first interlayer insulating film 120 to define the lower contact holes LH in the first interlayer insulating film 120. In other words, the first interlayer insulating pattern 122, as illustrated in FIG. 9, may have lower contact holes LH arranged in a matrix shape, i.e., the first interlayer insulating pattern 122 having a top surface of lattice shape (or a mesh shape) may be formed. The first interlayer insulating pattern 122 may include first portions 122a extending in a specific direction (y axis direction) and second portions 122b locally disposed to be spaced apart from one another between the first portions 122a. Also, according to an embodiment, the lower contact holes LH defined in the first interlayer insulating pattern 122 may expose source and drain regions 101 formed in the substrate 100.

By using the first sacrificial pattern 132 constituted by a material having carbon as a main ingredient, the lower contact holes LH having an aspect ratio of about 2:1 to about 16:1 may be formed in the first interlayer insulating film 120. Also, in an embodiment, the lower contact holes LH may have a width of about 10 nm to about 40 nm. Further, a width of the lower contact hole LH may be smaller than a line width of the word line WL or the bit line BL.

A plane area of the lower contact holes formed in the first interlayer insulating film 120 may be different depending on a pitch and a line width of the first and second mask patterns 142 and 172. According to an embodiment, in FIGS. 3 and 5, pitches and line widths of the first and second mask patterns 142 and 172 may be substantially same. Alternatively, a pitch and a line width of the first mask pattern 142 may be different from a pitch and a line width of the second mask pattern 172.

After forming the first interlayer insulating pattern 122, the first sacrificial pattern 132 may be removed by an ashing process and/or a stripping process.

Figure 10:
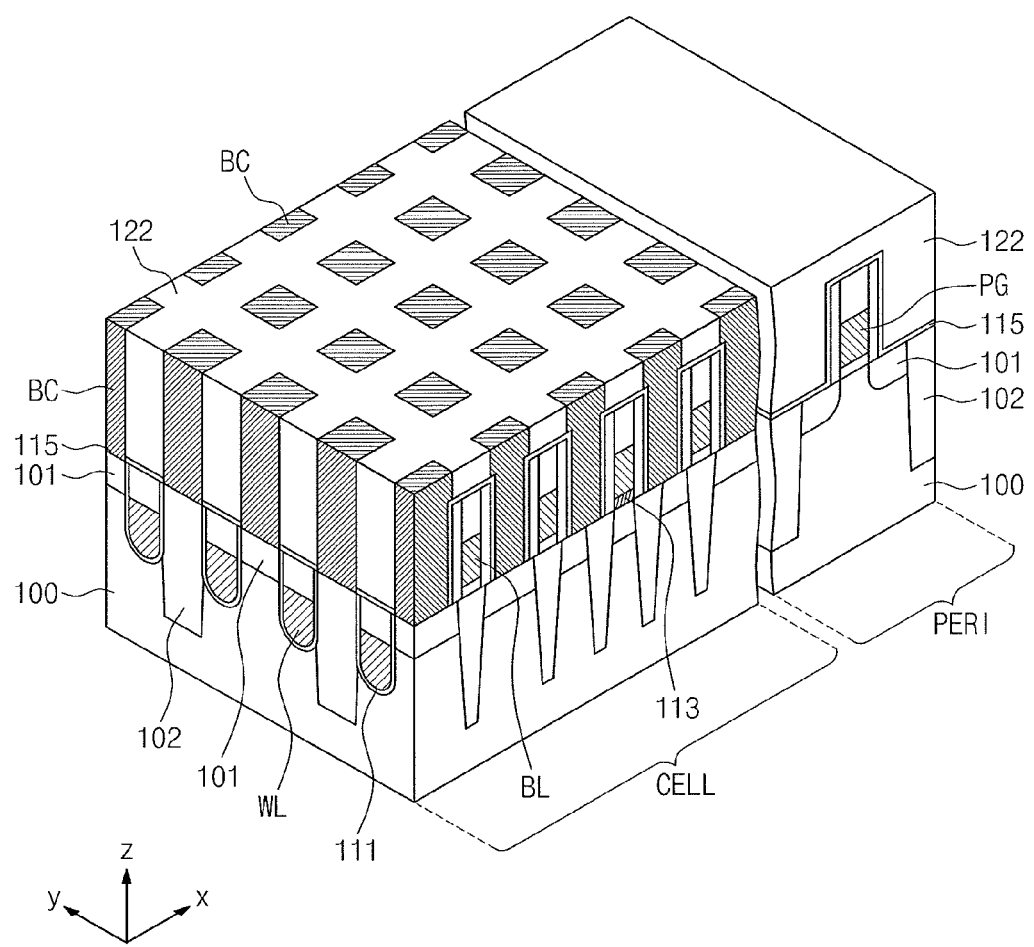

Referring to FIG. 10, contact plugs BC connected to the source and drain regions 101 are formed in the lower contact holes LH.

The contact plugs BC may be formed by depositing a conductive film filling the lower contact hole LH and then planarizing the conductive film. The contact plug BC may be formed of at least one of a polysilicon film, a metal film, a metal nitride film and a metal silicide film that are doped with an impurity or combinations thereof.

The contact plugs BC formed in the lower contact holes LH may have a line width smaller than a line width of the word line WL or the bit line BL. The contact plugs BC may be spaced apart from the etch-stop film 115 formed on a sidewall portion of the bit lines BL and a sidewall insulating films. For example, the contact plugs BC may averagely have a width of about 10 nm to about 40 nm. Also, the contact plugs BC may have an aspect ratio of about 4:1 to about 16:1.

Figure 11:
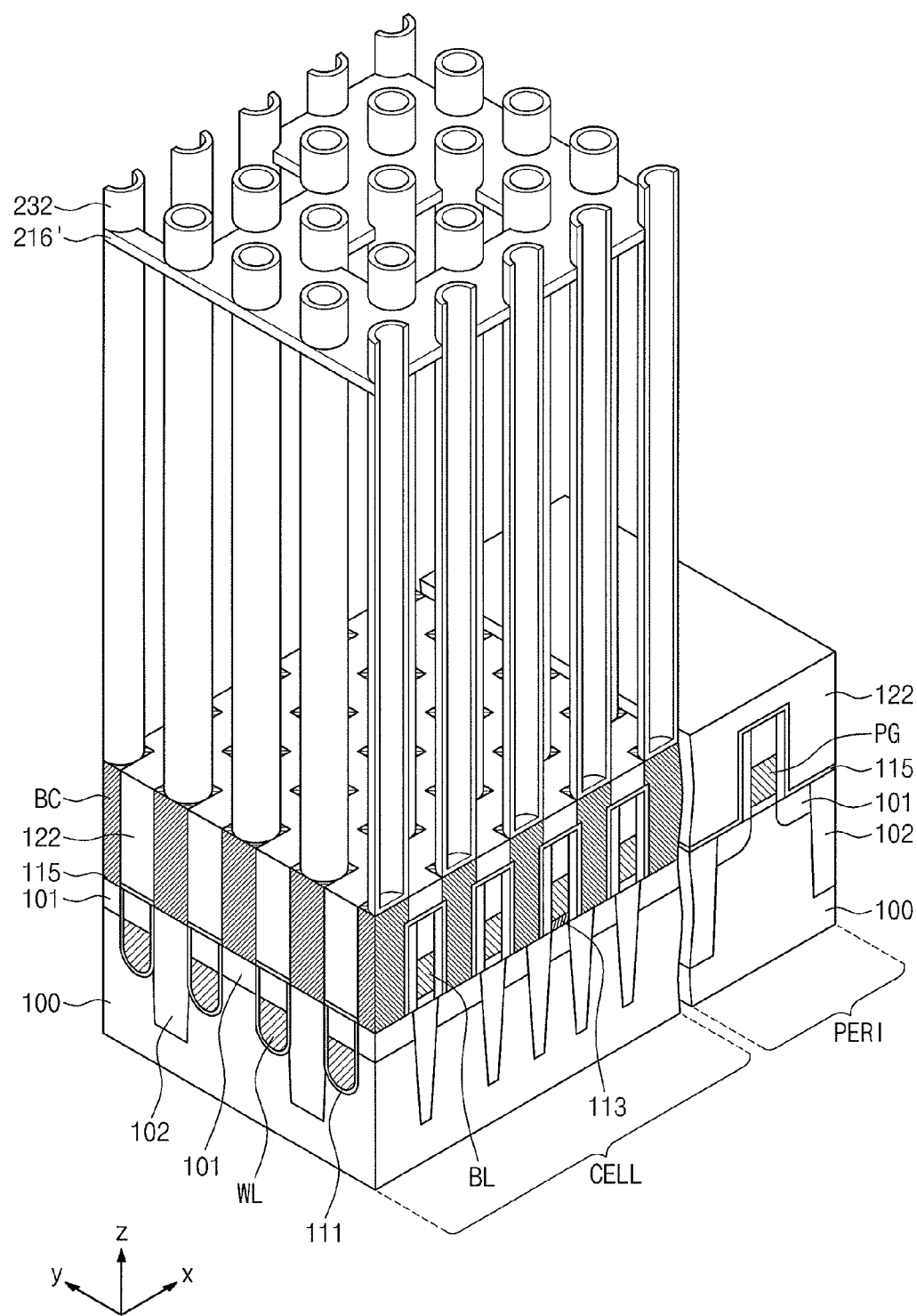

Referring to FIG. 11, a capacitor of semiconductor memory device (e.g., DRAM device) may be formed on an upper portion of each of the contact plugs BC. For example, a capacitor may include a storage electrode 232, a dielectric film (not illustrated), and an electrode (not illustrated). The storage electrode 232 may be formed on an upper portion of each of the contact plugs BC. The storage electrode 232 may be formed in a cylindrical shape having a space therein.

Forming the storage electrode 232 may include forming a mold film (not shown) in which storage holes (not shown) are defined on the first interlayer insulating pattern 122 in which the contact plugs BC are formed, conformally depositing a conductive film in the storage holes to the storage electrodes 232, preventing the collapse of the storage electrodes 232 by a support pattern 216' connecting sidewalls of the storage electrodes 232 and removing the mold film. Herein, a method of forming the mold film in which the storage holes are defined, as illustrated in FIGS. 2 through 9, may be the same with a method of forming the lower contact holes LH in the first interlayer insulating film 120. That is, the mold film in which the storage holes are defined may be formed using a mask structure formed from a material having carbon as a main ingredient. After forming the storage electrodes 232, a dielectric film (not shown) and an upper electrode (not shown) may be sequentially formed.

According to a method of manufacturing a semiconductor device in accordance with embodiments of the inventive concept, holes having an aspect ratio of about 6:1 to about 16:1 may be formed using a mask structure formed from a material having carbon as a main ingredient. Also, the holes may have a width of about 10 nm to about 40 nm.

In contrast, as a design rule of the semiconductor device is reduced, when a conventional method is used to form fine holes with a high aspect ratio via a photoresist pattern, an aspect ratio of the photoresist pattern increases, thereby causing the photoresist pattern to collapse. Also, as a thickness of the photoresist pattern in the conventional method is reduced to have a fine line width, while attempting to prevent collapse of the photoresist pattern, when forming fine patterns having a great aspect ratio by etching a lower film for forming patterns, the photoresist pattern may not sufficiently function as a mask.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. A method of manufacturing a semiconductor device, the method comprising:
   forming a lower film including a cell region and a peripheral circuit region;
   forming a first sacrificial film on the lower film, the first sacrificial film having trenches in the cell region;
   forming a second sacrificial pattern on the first sacrificial film, the second sacrificial pattern having line-shaped patterns spaced apart from each other and crossing the trenches in the cell region, and the second sacrificial pattern covering a top surface of the first sacrificial film in the peripheral circuit region; and
   patterning the first sacrificial film to form upper holes in portions of the trenches exposed by the second sacrificial pattern.

2. The method as claimed in claim 1, wherein the first sacrificial film and the second sacrificial pattern are formed from a material having carbon as a main ingredient.

3. The method as claimed in claim 1, wherein forming the first sacrificial film includes:
   forming first mask patterns on the first sacrificial film, the first mask patterns exposing a top surface of the first sacrificial film in the peripheral circuit and portions of the first sacrificial film in the cell region; and
   forming the trenches by patterning the first sacrificial film using the first mask patterns.

4. The method as claimed in claim 3, wherein forming the first sacrificial film includes using a chemical vapor deposition process to form an amorphous carbon layer.

5. The method as claimed in claim 3, wherein forming the lower film includes forming word lines and bit lines crossing the word lines in the cell region, the first mask patterns crossing the word lines or the bit lines.

6. The method as claimed in claim 3, wherein forming the second sacrificial patterns includes:
   forming a second sacrificial film filling the trenches in the first sacrificial film;
   forming second mask patterns crossing the trenches in the second sacrificial film of the cell region; and
   patterning the second sacrificial film using the second mask patterns to expose the first sacrificial film.

7. The method as claimed in claim 6, wherein forming the second sacrificial film includes using a spin-on coating technology to deposit a material having carbon as a main ingredient.

8. The method as claimed in claim 6, wherein forming the first and second mask patterns includes depositing material to a thickness of about 0.1 to about 0.5 of a thickness of the first and second sacrificial films, respectively.

9. The method as claimed in claim 6, wherein forming the first and second mask patterns includes depositing at least one of SiON, $SiO_2$, $Si_3N_4$, SiCN, and polysilicon.

10. The method as claimed in claim 1, wherein patterning the first sacrificial film includes forming a first sacrificial pattern with first portions parallel to one another and second portions spaced apart from one another between adjacent first portions, top surfaces of the first portions being lower than top surfaces of the second portions.

11. The method as claimed in claim 10, further comprising forming lower holes under the upper holes by patterning the lower film using the first sacrificial pattern.

12. The method as claimed in claim 11, wherein forming the lower film includes:
   forming word lines and bit lines crossing the word lines;
   forming MOS transistors using the word lines as gate electrodes in the cell region; and
   forming contact plugs electrically connected to the MOS transistors by filling the lower holes with a conductive material.

13. The method as claimed in claim 11, wherein forming the lower holes includes forming holes with an aspect ratio of about 2:1 to about 16:1.

14. The method as claimed in claim 11, wherein forming the lower holes includes forming holes with a width of about 10 nm to about 40 nm.

15. A method of manufacturing a semiconductor device, the method comprising:
   forming a first sacrificial film on a lower film including a cell region and a peripheral circuit region;
   forming first mask patterns on the first sacrificial film in the cell region;
   forming trenches in the cell region of the first sacrificial film by patterning the first sacrificial film using the first mask patterns;
   forming a second sacrificial film in the trenches and on the first mask patterns;
   forming second mask patterns on the second sacrificial film, the second mask patterns crossing the first mask patterns and covering the first sacrificial film of the peripheral circuit region; and
   patterning the first sacrificial film using the first mask patterns and the second mask patterns to form a first sacrificial pattern having upper holes exposing the lower film in the trenches.

16. A method of manufacturing a semiconductor device, the method comprising:
   forming a first sacrificial film on a lower film including a cell region and a peripheral circuit region;
   forming trenches in the cell region of the first sacrificial film, such that the trenches are spaced apart from each other and extend along a top surface of the lower film;
   forming a second sacrificial film on the first sacrificial film, such that the second sacrificial film fills the trenches in the first sacrificial film and covers a top surface of the first sacrificial film;
   patterning the second sacrificial film to form sacrificial patterns spaced apart from each other and crossing the trenches in the first sacrificial film, the sacrificial patterns exposing portions of the first sacrificial film;
   patterning the first sacrificial film using the sacrificial patterns of the second sacrificial film as a mask to expose portions of the top surface of the lower film; and
   patterning the lower film exposed through the patterned first sacrificial film.

17. The method as claimed in claim 16, wherein forming the first and second sacrificial films includes depositing a material including about 80% by weight to about 99% by weight of carbon, based on a total weight of each of the first and second sacrificial films.

18. The method as claimed in claim 16, wherein forming the first and second sacrificial films includes depositing a material consisting essentially of carbon.

19. The method as claimed in claim 16, wherein patterning the first sacrificial film includes forming a grid with holes exposing portions of the top surface of the lower film, the grid including first portions defined by segments of the first sacrificial film between the trenches along the first direction and second portions defined by the second sacrificial patterns along the second direction.

20. The method as claimed in claim 19, wherein:
forming the first portions includes forming linear portions spaced apart from each other along the second direction, and
forming the second portions includes forming segments spaced apart from each other along the first and second directions, the second portions being shorter than the first portions relative to the lower film.

* * * * *